(12) United States Patent
Grimaud

(10) Patent No.: US 10,250,140 B2
(45) Date of Patent: Apr. 2, 2019

(54) SWITCHING CONTROLLER

(71) Applicant: SAFRAN ELECTRONICS & DEFENSE, Boulogne Billancourt (FR)

(72) Inventor: Louis Grimaud, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 16/061,851

(22) PCT Filed: Nov. 30, 2016

(86) PCT No.: PCT/EP2016/079348
§ 371 (c)(1),
(2) Date: Jun. 13, 2018

(87) PCT Pub. No.: WO2017/102337
PCT Pub. Date: Jun. 22, 2017

(65) Prior Publication Data
US 2018/0367037 A1 Dec. 20, 2018

(30) Foreign Application Priority Data
Dec. 15, 2015 (FR) .................................. 15 62364

(51) Int. Cl.
*H02M 3/158* (2006.01)
*H02M 1/34* (2007.01)
*G05F 1/10* (2006.01)
*H03K 17/0814* (2006.01)

(52) U.S. Cl.
CPC .............. *H02M 3/158* (2013.01); *G05F 1/10* (2013.01); *H02M 1/34* (2013.01); *H03K 17/08148* (2013.01); *F05D 2220/30* (2013.01)

(58) Field of Classification Search
CPC ........ H02M 3/325; H02M 3/335; H02M 3/28; H02M 3/33569; H02M 1/12; H02M 1/14; H02M 1/4266; H02M 7/5395; H02M 3/3155; H02M 7/537; H02M 7/5383; H02M 7/5387; H02M 7/53871; H02M 3/337; H02M 3/338; H02M 3/3382
USPC ................ 363/16, 17, 40, 41, 131, 132, 133
See application file for complete search history.

(56) References Cited

U.S. PATENT DOCUMENTS

| | | | | | |
|---|---|---|---|---|---|
| 6,828,762 | B2* | 12/2004 | Brkovic | .................. | H02M 3/28 323/222 |
| 7,379,309 | B2* | 5/2008 | Isurin | ...................... | H02M 1/36 363/17 |
| 2008/0192521 | A1* | 8/2008 | Lacombe | ................ | H02M 1/34 363/124 |

FOREIGN PATENT DOCUMENTS

EP        1959549 A1    8/2008

* cited by examiner

*Primary Examiner* — Nguyen Tran
(74) *Attorney, Agent, or Firm* — Muncy, Geissler, Olds & Lowe, P.C.

(57) ABSTRACT

In order to reduce the cost of a switch-mode converter delivering a continuous voltage to the terminals of a load (Z), the present invention proposes a circuit having two windings (Lp, Ls) and a single magnetic core.

14 Claims, 11 Drawing Sheets

SWITCHING CONTROLLER

The invention relates to a single pole or two pole switch-mode converter operating in the quadrant (Is>0, Vs>0) and (Is<0, Vs<0), and at zero outlet current or voltage, possessing coupled magnetic windings, and capable of being configured with its mode of regulation adapted to current source or to voltage source. It applies to all types of terrestrial, marine, or aviation equipment using this type of switch-mode converter, and in particular to the electromechanical actuator controls of turbine engine regulators.

The invention also relates to an electromechanical actuator control including such a converter, to a regulator including such a converter, to terrestrial, marine, or aviation equipment including such a converter, and to a turbine engine including such a converter.

TECHNOLOGICAL BACKGROUND OF THE INVENTION

The control of electrical actuators involving an RL type load (i.e. resistance and induction in series) may be performed either by applying a regulated voltage to the terminals of the control coil of the actuator, or by using a current source, which solution is often preferred in a severe environment since it makes it possible essentially to limit the power used for controlling the accessory and to simplify the associated corrector.

Switch-mode current sources can conventionally be considered either as being current sources that use the inductance of the load as an energy storage element during the switching operation, with the consequence of applying an alternating current (AC) voltage to the terminals of the load, which voltage alternates between positive and negative at the switching frequency, with the transitions between these two states ideally being considered as being instantaneous, or as being current sources that supply continuous current and consequently supply a continuous voltage to the terminals of the load, and where the energy storage element for switching is situated on the control circuit card itself.

Switch-mode current sources using the inductance of the load as the energy storage element have the advantage of being controllable in a manner that, at first sight, is simple. They include few or even no inductive elements, thereby leading to savings in the dimensions of the circuit. However, they present a certain number of drawbacks. They are very dependent on the inductance of the load: the ability of the switches in the current source to switch current instantaneously depends directly on the inductance of the load. It is very difficult to withstand short circuits between the outlet terminals of the converter or between either outlet terminal and ground. Specifically, in the event of the load short-circuiting, it is not possible to limit the instantaneous current, unless additional components are provided. Consequently, it is necessary in practice to add an outlet inductor to the converter in order to limit its short-circuit current, to add a protection device that switches very fast for limiting the maximum value of the short-circuit current, to add a circuit for demagnetizing the outlet inductor to manage switching off after detecting an outlet short circuit, and to overdimension the interfaces (inlet filter capacitor) so that they can withstand the short-circuit current. Concerning electromagnetic compatibility (essentially by conduction), these converters are difficult to make compatible with aviation standards, if it is desired to have a high switch-mode frequency in order to limit the overall size of the passive components of the converters, particularly if the load is controlled at the end of several meters of cable. This leads to a reduced switch-mode frequency that is typically lower than 10 kilohertz (kHz) and to the need to design an outlet filter (both common mode and differential mode) that plays a major role on overall stability and that presents non-negligible size. That type of switch-mode current source is restricted to high-power applications for which a low switch-mode frequency is not necessarily a handicap. For converters delivering a continuous voltage to the terminals of the load, switching no longer takes place in the load, and the current (or the voltage) is regulated at the outlet of a switch-mode converter having an inductor that stores at least all of the energy that is transferred to the load and a capacitor is added in order to smooth the outlet voltage. Consequently, the outlet voltage is practically continuous at the terminals of the load. There is thus less difficulty in complying with aviation standards for noise transmitted by conduction. In the event of the load short circuiting, the current through the converter naturally remains limited. It is possible to envisage switch-mode frequencies exceeding 100 kHz, limited specifically by the efficiency of the converter and by the performance of the grid control circuits of the switch elements.

FIG. 1A is a circuit diagram of a prior art converter delivering a continuous voltage to the terminals of a load. The circuit is powered by a positive voltage Vp (e.g. +25 volts (V)) and by a negative voltage Vm (e.g. −25 V), both relative to ground. It has two elements T1 and T2, each having two magnetically coupled windings around a magnetic core. The windings of a given element T1 or T2 are wound in opposition, as indicated by dots in FIG. 1A. The winding E1 of the element T1 has a first end connected to the voltage Vp via a diode D5 that is reverse-connected relative to the voltage Vp, its second end being connected to ground. The winding E2 of the element T1 possesses a first end connected to a first terminal of a switch Q3 having its second terminal connected to the voltage Vo. The second end of the winding E2 is connected to the outlet terminal S1P of the circuit. The winding E3 of the element T2 possesses a first end connected to the voltage Vm via a diode D6 that is reverse-connected relative to the voltage Vm, its second end being connected to ground. The winding E4 of the element T2 possesses a first end connected to a first terminal of a switch Q4 having its second terminal connected to the voltage Vm. The second end of the winding E4 is connected to the outlet terminal S1P of the circuit. A smoothing capacitor C1 is connected between the outlet S1P and ground.

The converter is transformed into a current source by adding means for measuring the outlet current, and an appropriate regulator and an appropriate modulator. This is shown in FIG. 1B where the load connected to the outlet of the converter is represented in the form of a resistance Rc and an inductance Lc connected in series. The outlet current is measured by measurement means 1 that deliver a representative signal to a first inlet of regulator (or corrector) means 2. A second input Ec of the regulator means 2 receives a setpoint signal. The output signal from the regulator means 2 is applied to the input of a modulator 3 that delivers a control signal SQ3 to the switch Q3 and a control signal SQ4 to the switch Q4.

The converter shown in FIGS. 1A and 1B thus has four windings and two magnetic cores, thereby leading to relatively high costs and to an overall size of the circuit that is relatively large.

In order to reduce the cost and the size of such a converter, patent application EP 1 959 549 in the name of the present Applicant proposes a circuit having two windings coupled on a single magnetic core.

Nevertheless, in that circuit, the two windings present different numbers of turns in order to avoid possible problems of cross conduction. Unfortunately, that makes it necessary to have recourse to specific elements in order to create the windings, such that the converter continues to be of relatively high cost.

OBJECT OF THE INVENTION

An object of the invention is to propose a switch-mode converter that is of lower cost. The invention also relates to a control for an electromechanical actuator that includes such a converter, to a regulator that includes such a converter, to terrestrial, marine, or aviation equipment that includes such a converter, and to a turbine engine including such a converter.

BRIEF DESCRIPTION OF THE INVENTION

In order to achieve this object, there is provided a switch-mode converter powered by a positive voltage and a negative voltage, both relative to ground, and delivering an outlet voltage between a first outlet terminal and a second outlet terminal, which second outlet terminal is connected to ground either directly or via a resistance, the converter having two windings wound in opposition about a magnetic core:
- the first end of the first winding being connected to a midpoint of a first branch that connects the positive voltage to the negative voltage, the portion of the first branch connecting its midpoint to the positive voltage comprising a series connection of switch-forming first means and a first diode in forward connection relative to the positive voltage and together forming a unidirectional switch having forward and reverse blocking power, the portion of the first branch connecting its midpoint to the negative voltage comprising a series connection of second switch-forming means and a second diode forwardly mounted relative to the negative voltage and together forming a unidirectional switch having forward and reverse blocking power;
- a second end of the first winding being connected to the outlet terminal; and
- the first end of the second winding being connected to a midpoint of a second branch that connects the positive voltage to the negative voltage and that comprises a third diode and a fourth diode in reverse connection, the midpoint of the second branch being situated between the third diode and the fourth diode.

According to the invention, the converter includes third switch-forming means and fourth switch-forming means together forming a bidirectional switch having forward and reverse blocking power, the third and fourth means being arranged in series between the second end of the second winding and ground.

Because of the assembly formed by the third and fourth means, it is possible to control the passage of current in the second winding connected to ground via said assembly.

There is therefore no longer any need to have asymmetry between the two windings. Since the first winding and second winding can present identical numbers of turns, it is possible to have recourse to standard commercially available elements in order to form the windings, thereby reducing the price of the converter.

In addition, these elements remain relatively compact, which means that it is possible to avoid excessively increasing the dimensions of the converter.

In a particular embodiment, a smoothing capacitor is connected between the first outlet terminal of the converter and ground.

In a particular embodiment, in the first branch connecting the positive voltage to the negative voltage, said series connection consists in arranging the first and second switch-forming means beside the respective positive and negative voltages and in arranging the first and second diodes beside the midpoint of the first branch.

In a particular embodiment, the first, second, third, and fourth switch-forming means are selected from metal oxide semiconductor (MOS) transistors, bipolar transistors, and insulated gate bipolar transistors, or any other switch having a capacity for conducting bidirectionally and a capacity for forward blocking.

In a particular embodiment, the third and fourth switch-forming means are selected from MOS transistors.

In a particular embodiment, the third and fourth switch-forming means are respectively one of them an N channel MOS transistor and the other one a P channel MOS transistor.

In a particular embodiment, the third switching means is of the same type as the first switch-forming means.

In a particular embodiment, the second switch-forming means is of the same type as the fourth switch-forming means.

In a particular embodiment, the converter further comprises measurement means for measuring the outlet voltage of the converter, the measurement means delivering an output signal representative of the outlet voltage to a first input of regulator means having a second input receiving a setpoint signal, the regulator means delivering a signal that is supplied to the input of a modulator having a first output sending a common control signal to the first switch-forming means and to the third switch-forming means, and having a second output sending a common control signal to the second switch-forming means and to the fourth switch-forming means, the converter thus being configured as a voltage source.

In a particular embodiment, the converter further comprises measurement means for measuring the outlet current of the converter, the measurement means delivering an output signal representative of the outlet current of the converter to a first input of regulator means having a second input receiving a setpoint signal, the regulator means delivering a signal that is supplied to the input of a modulator having a first output that sends a common control signal to the first switch-forming means and to the third switch-forming means, and a second output that sends a common control signal to the second switch-forming means and to the fourth switch-forming means, the converter thus being configured as a current source.

The invention also provides an electromechanical actuator control including a switch-mode converter as specified above.

The invention also provides a regulator including a switch-mode converter as specified above.

The invention also provides a terrestrial, marine, or aviation equipment including a switch-mode converter as specified above.

The invention also provides a turbine engine including a switch-mode converter as specified above.

Figure 2:
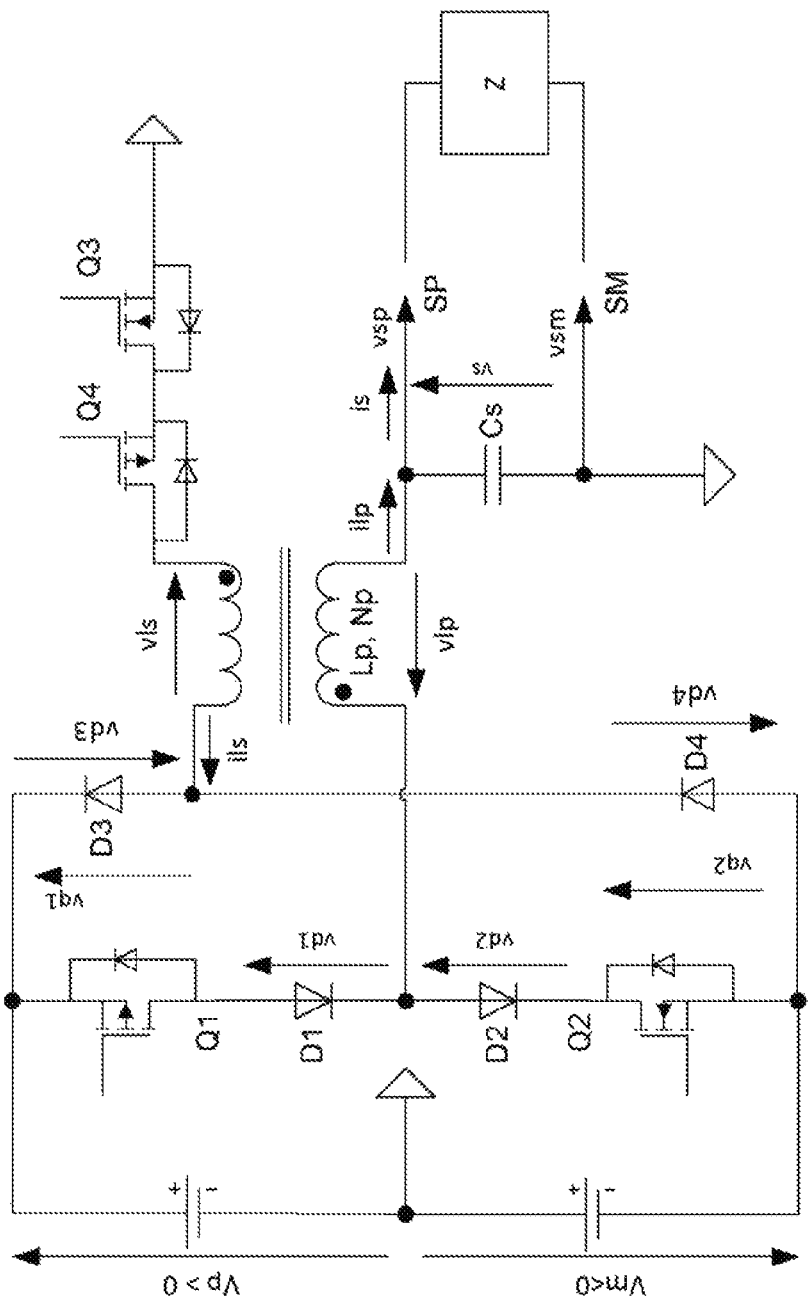
Figure 3A:
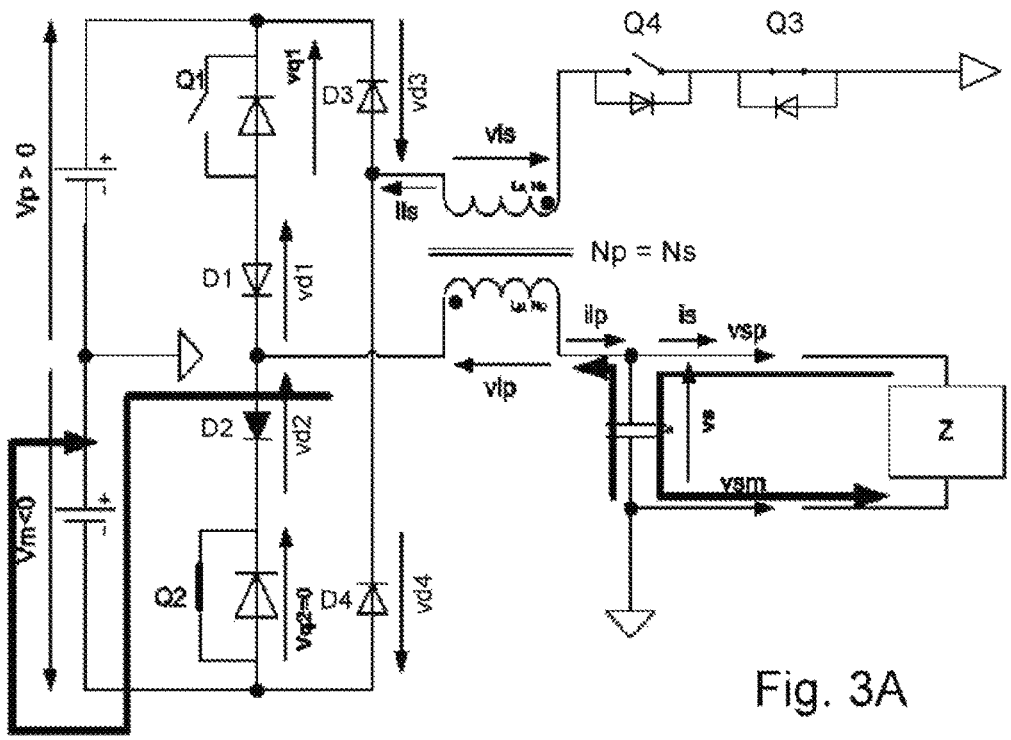
Figure 3B:
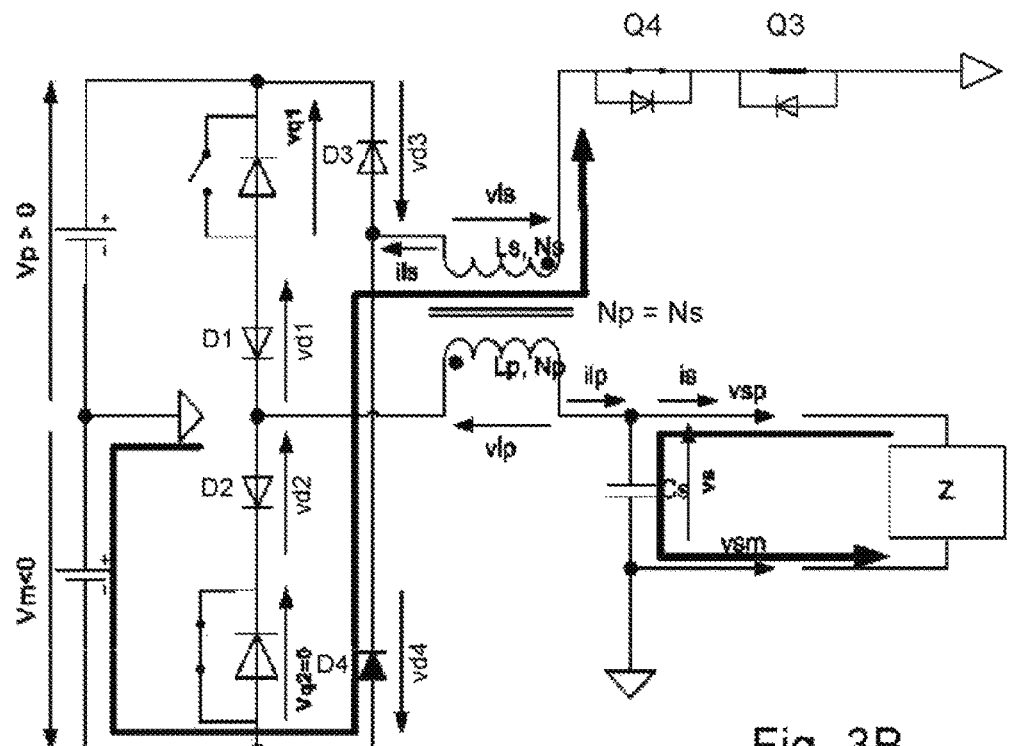
Figure 3C:
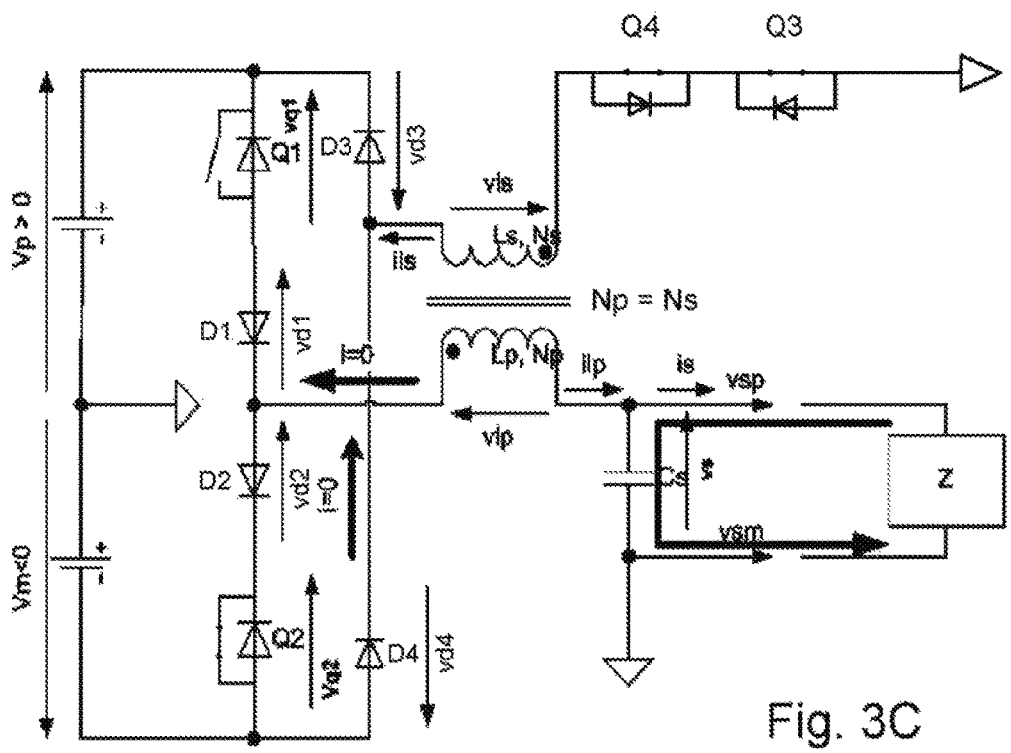
Figure 3D:
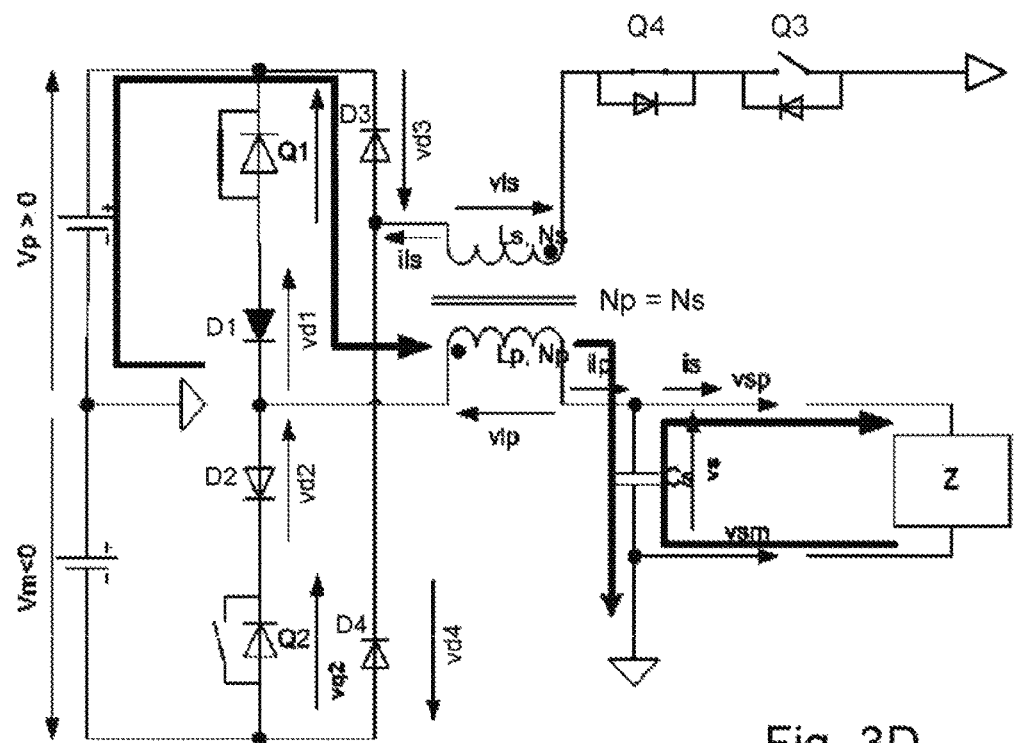
Figure 3E:
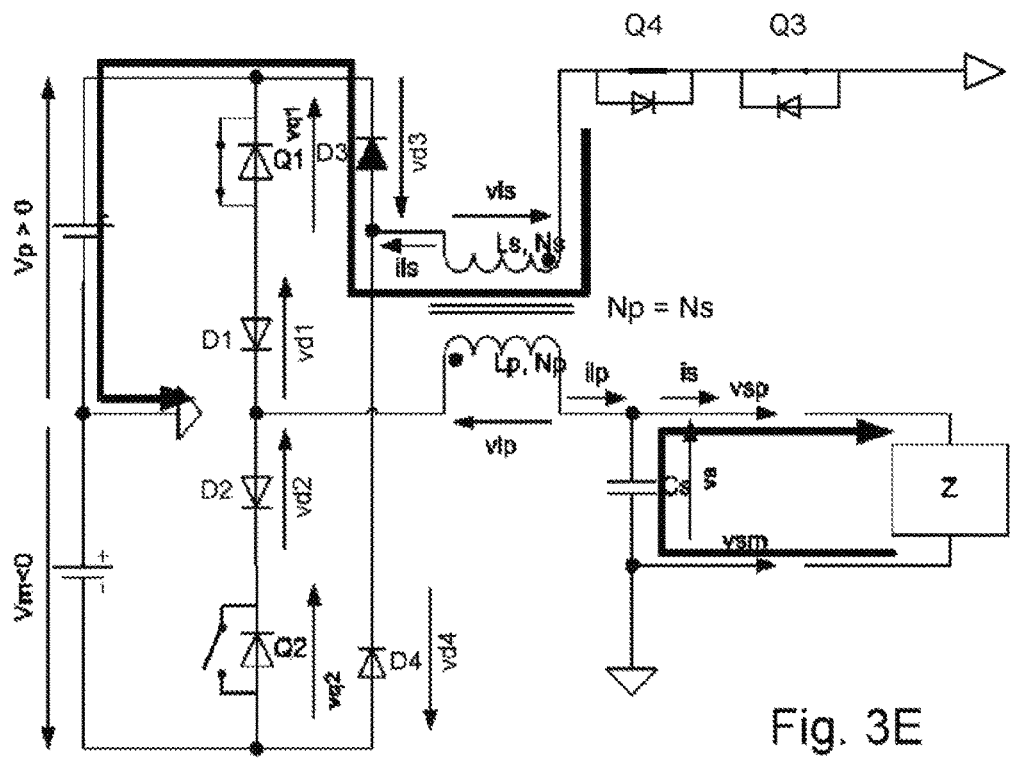
Figure 3F:
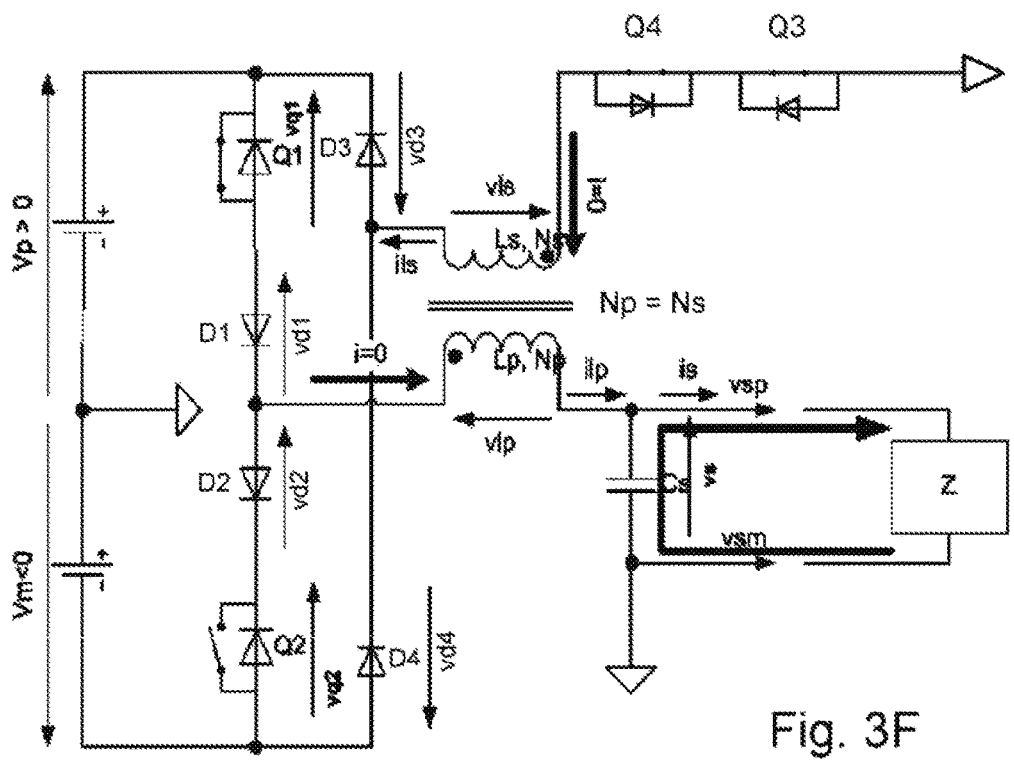
Figure 3G:
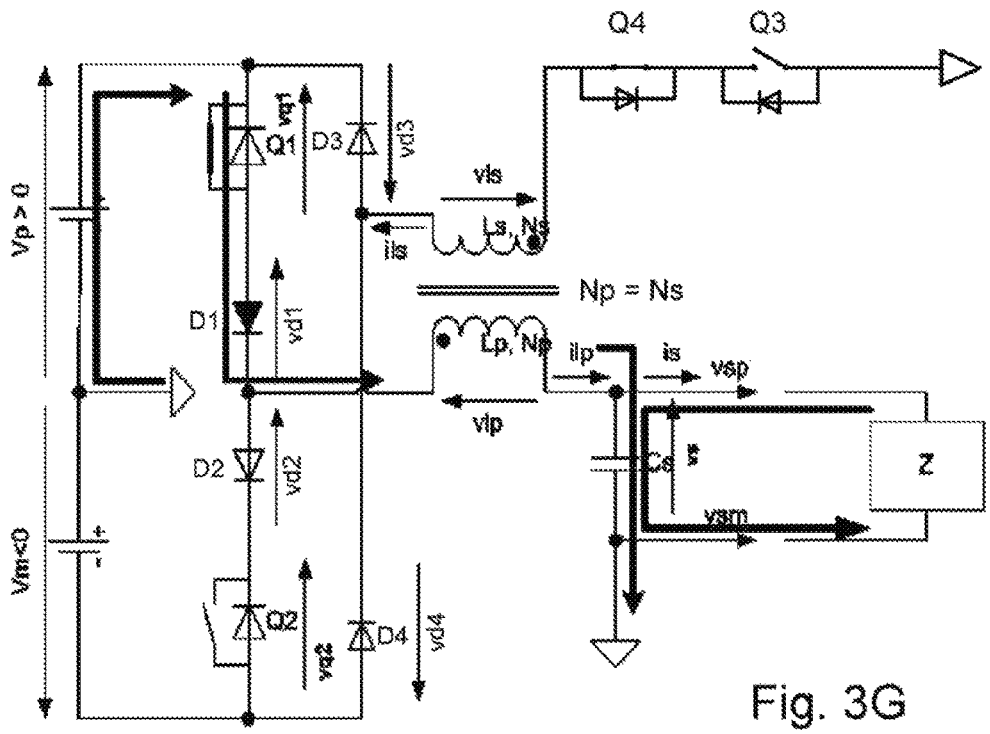
Figure 3H:
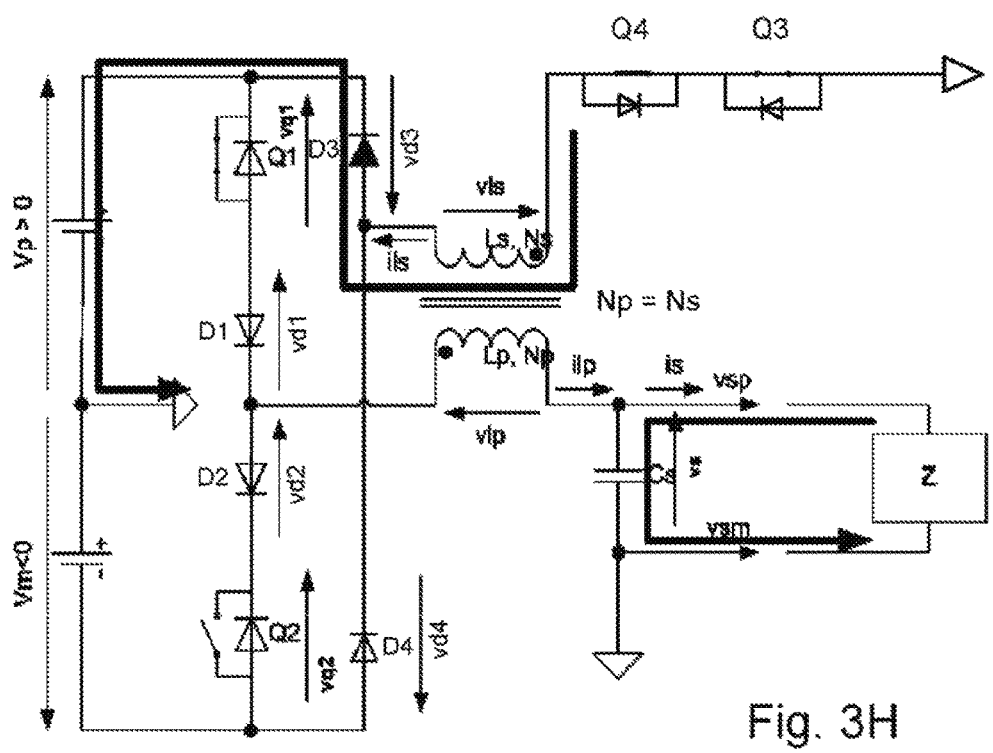
Figure 3I:
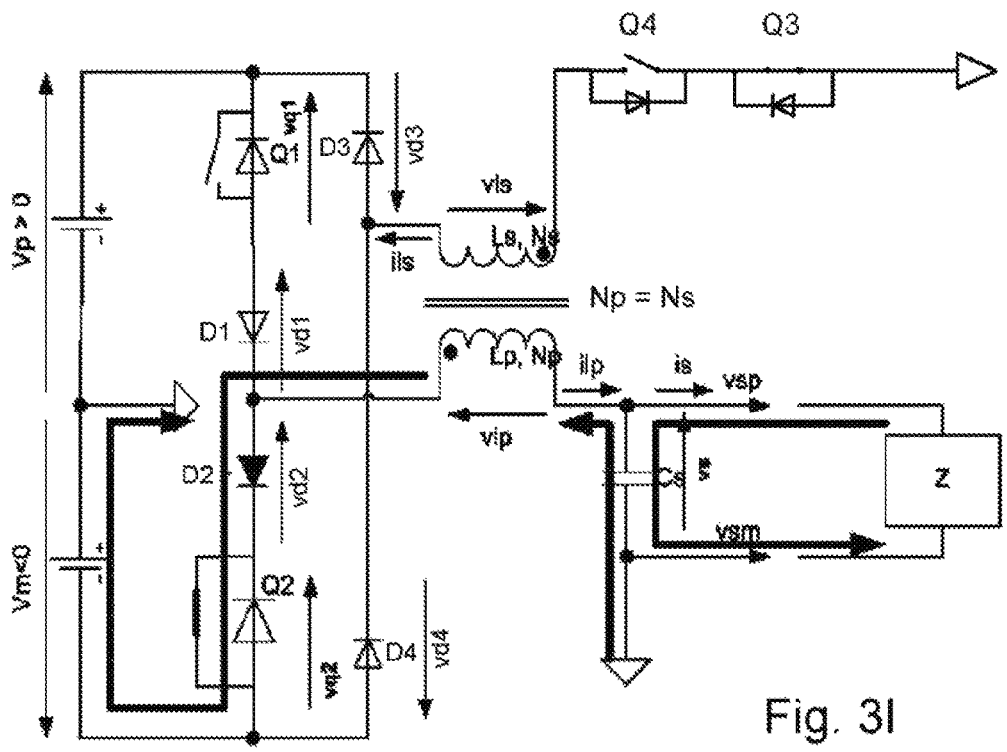
Figure 3J:
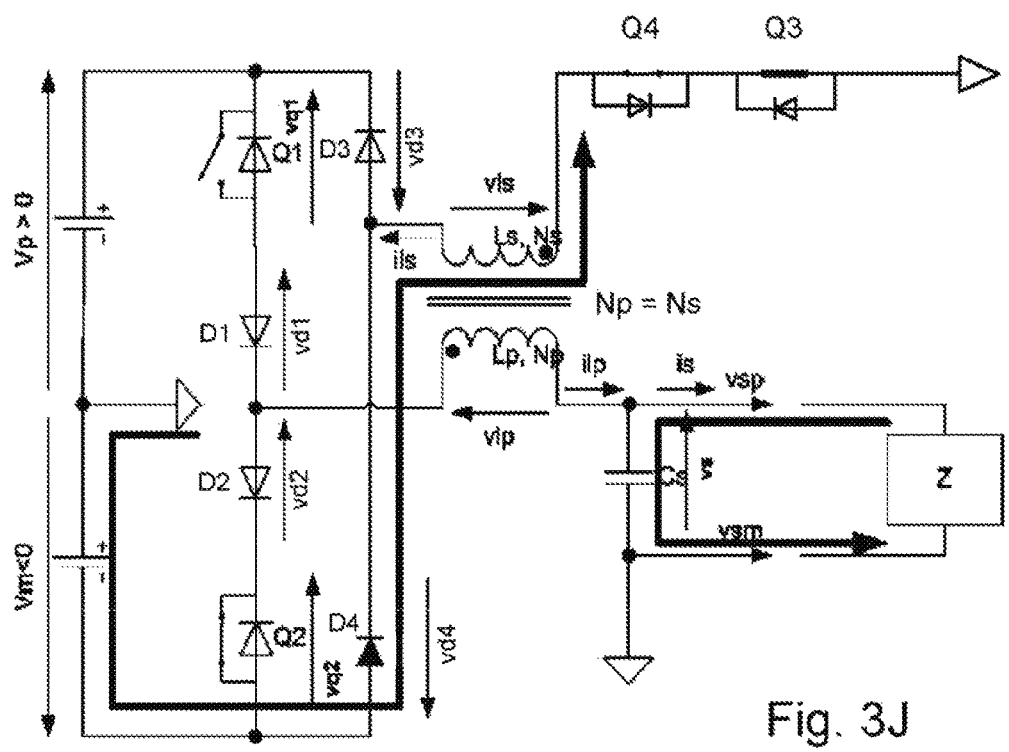
Figure 3K:
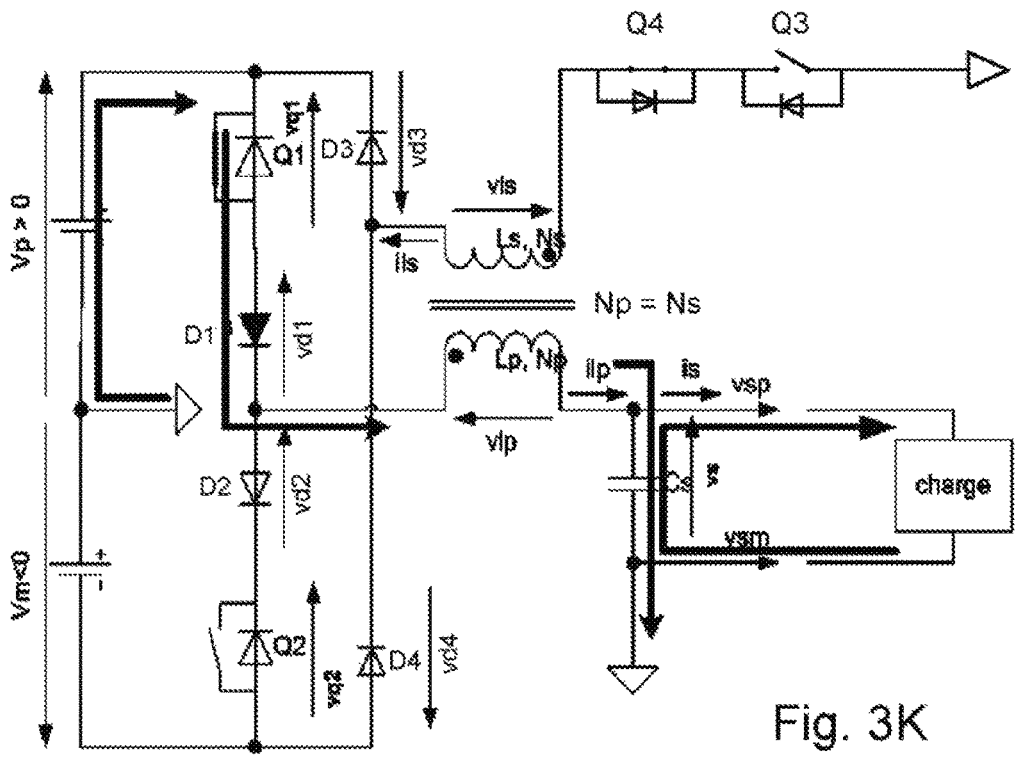
Figure 3L:
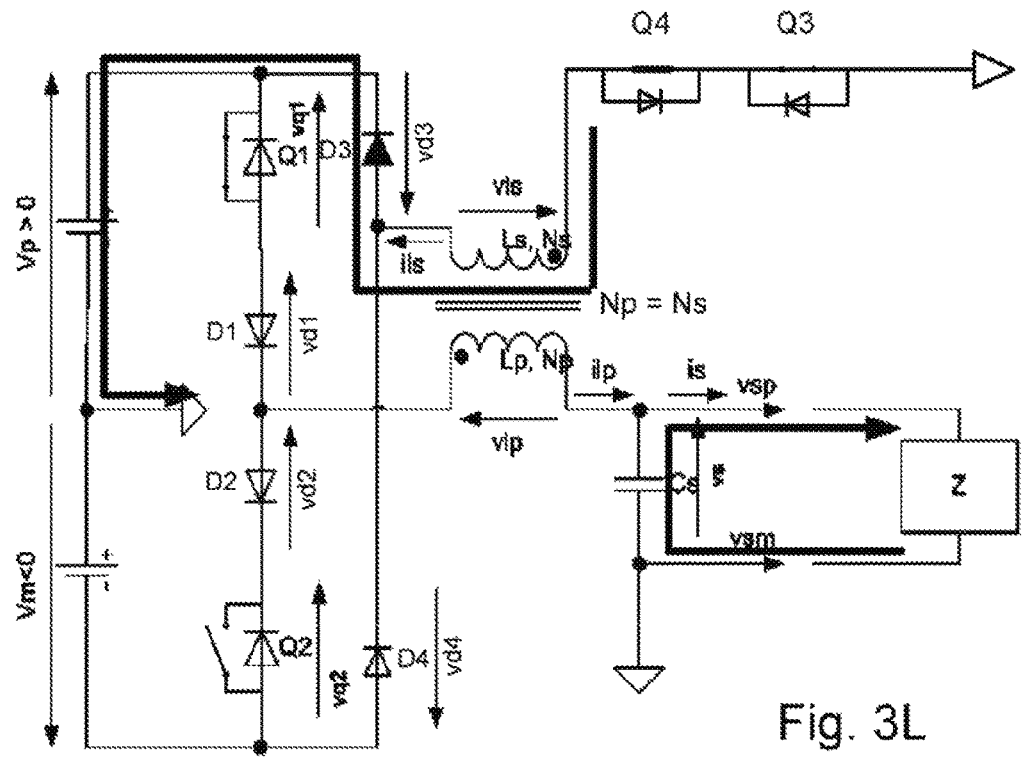
Figure 3M:
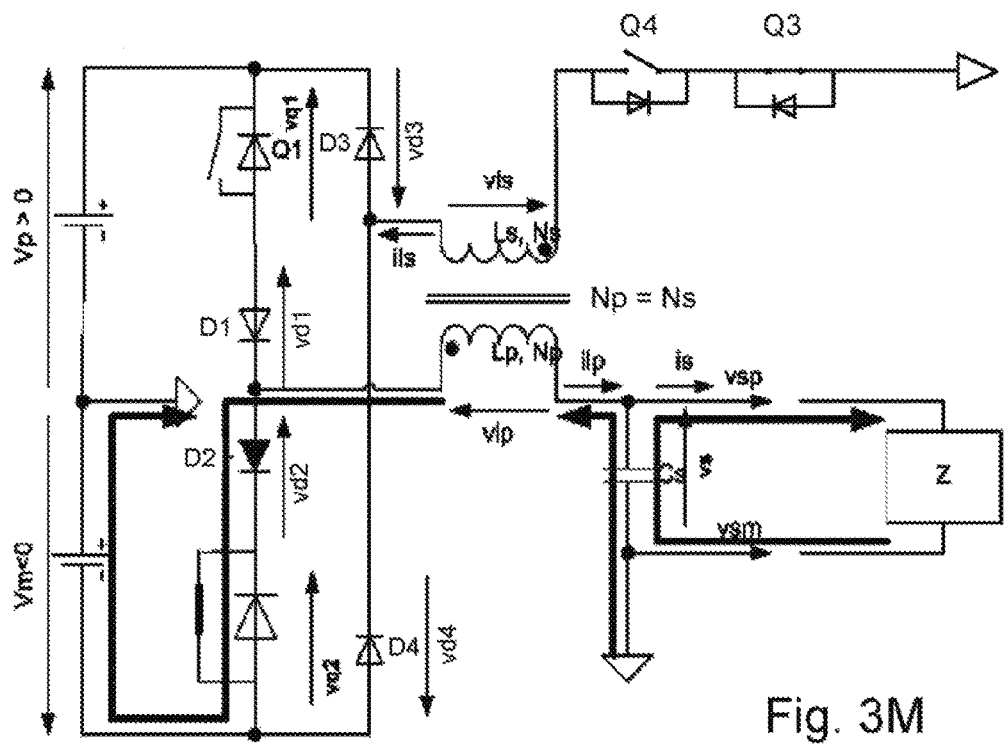
Figure 3N:
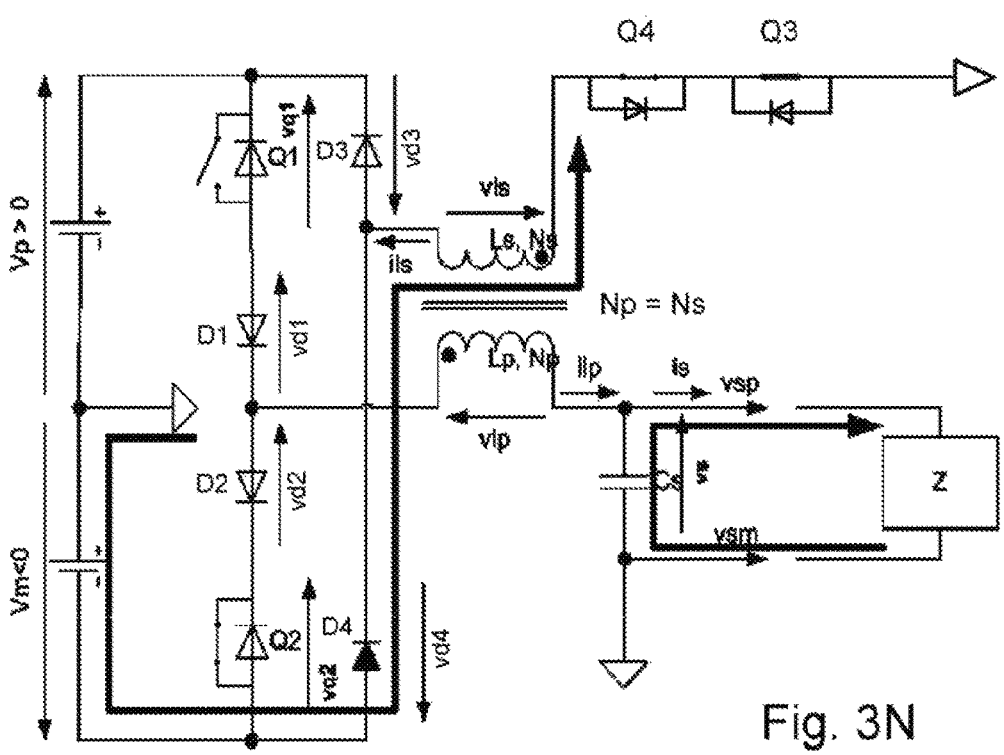
Figure 4A:
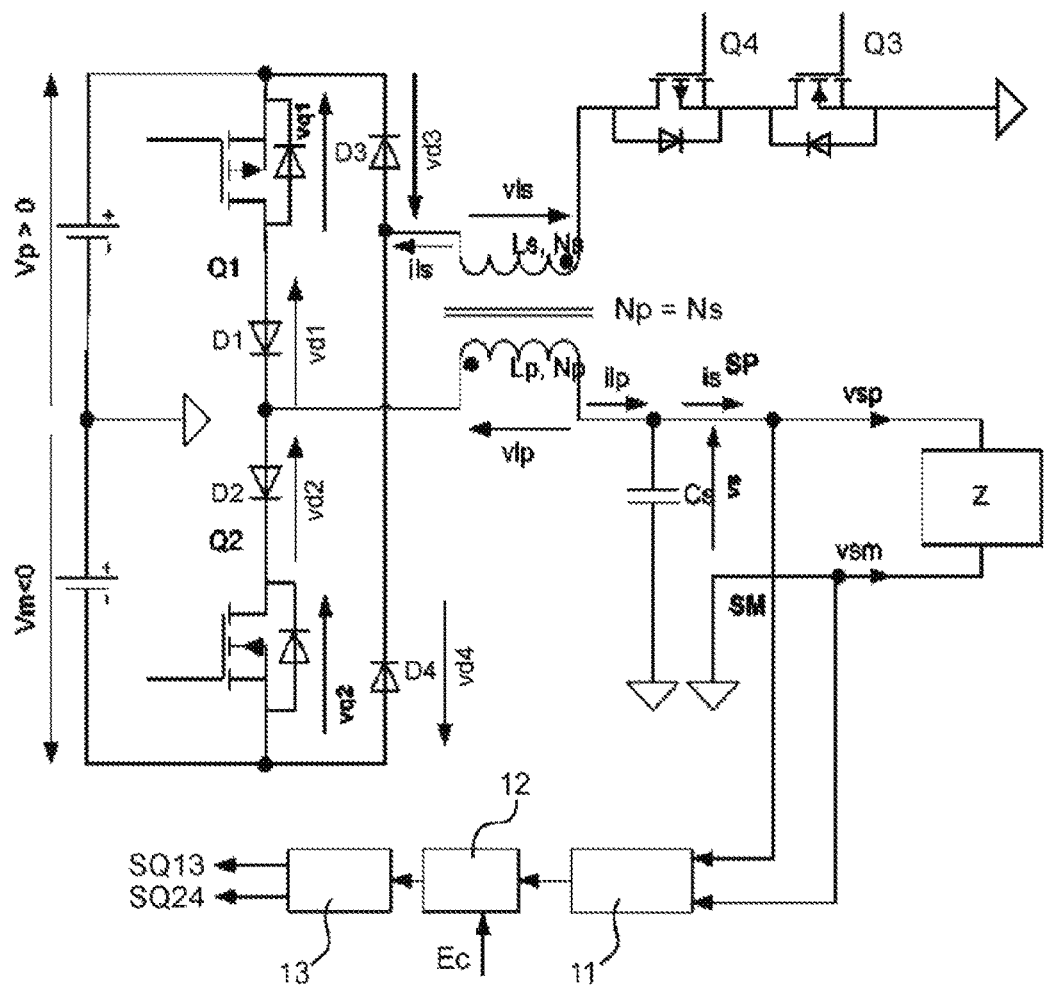
Figure 4B:
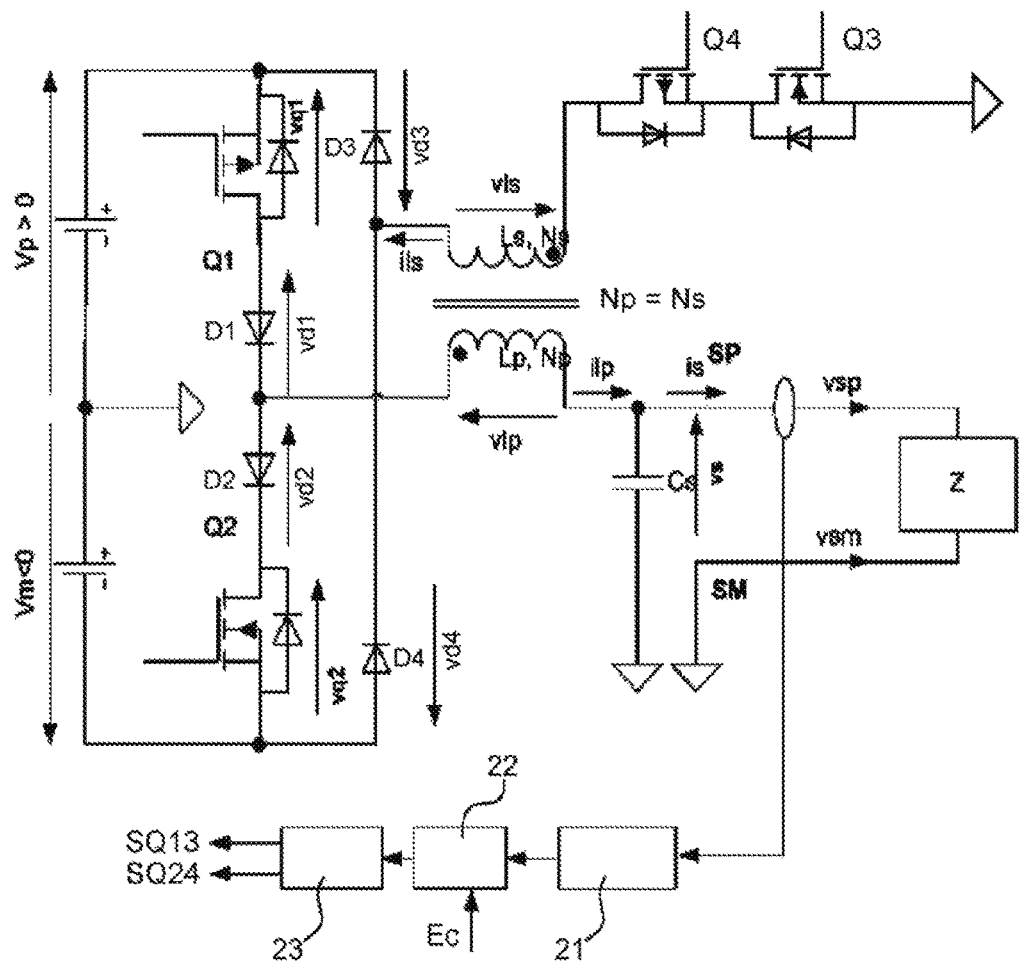

The invention can be better understood and other advantages and features appear on reading the following description, given by way of non-limiting example, and accompanied by the accompanying drawings, in which:

FIG. 2 is a circuit diagram of a switch-mode converter of the invention delivering a DC voltage to the terminals of a load;

FIGS. 3A to 3N show how the present invention operates;

FIG. 4A shows the principle of using the converter of the invention as a voltage source; and FIG. 4B shows the principle of using the converter of the invention as a current source.

DETAILED DESCRIPTION OF THE INVENTION

FIG. 2 is a circuit diagram of a switch-mode converter delivering a DC voltage to the terminals of a load in a particular embodiment of the present invention.

The converter is powered by a positive voltage Vp (e.g. +25 V) and by a negative voltage Vm (e.g. −25 V), both relative to ground.

It includes a transformer-forming element having two windings Lp, Ls that are wound around a single magnetic core. The winding directions are indicated by dots in FIG. 2. The winding Ls constitutes the secondary of the transformer-forming element and the winding Lp constitutes the primary of the transformer-forming element. Np is the number of turns of the winding Lp, and Ns is the number of turns of the winding Ls, and in this example Np is substantially equal to Ns.

The winding Lp has a first end connected to the cathode of a diode D1 and to the anode of a diode D2. The second end of the winding Lp is connected to the first outlet terminal SP of the circuit. A smoothing capacitor Cs is connected between the first outlet terminal SP and ground. The second outlet terminal SM may be connected directly to mechanical ground, or it may be connected thereto via a resistor, depending on the requirements of the user.

Furthermore, a first terminal of a switch Q1 is connected to the anode of the diode D1 and its second terminal is connected to the voltage Vp. A first terminal of a switch Q2 is connected to the cathode of the diode D2 and its second terminal is connected to the voltage Vm.

The switches Q1 and Q2 are advantageously transistor elements.

Preferably, the two switches Q1 and Q2 are N channel or P channel, depending on user requirements, metal oxide semiconductor field effect transistor (MOSFET) elements. In this example, the switch Q1 is of the P channel type and the switch Q2 is of the N channel type.

Furthermore, the winding Ls has a first end connected to the cathode of a diode D4 and to the anode of a diode D3. The cathode of the diode D3 is connected to the voltage Vp and the anode of the diode D4 is connected to the voltage Vm. The diode D3 is thus reverse-connected relative to the voltage Vp and the diode D4 is reverse-connected relative to the diode D3.

According to the invention, the second end of the winding Ls is connected to the first terminal of a switch Q4 having its second terminal connected to the first terminal of a switch Q3, the two switches together forming a bi-directional switch. The second terminal of the switch Q3 is connected to ground. The two switches Q3 and Q4 are thus connected in series between the winding Ls and ground.

The switches Q3 an Q4 are advantageously transistor elements.

This makes it possible to reduce the overall size of the converter, since the two switches can be housed in the same package given that they are connected in series directly one after the other.

Preferably, the two switches Q3 and Q4 are N channel or P channel, depending on user requirements, MOSFET elements. In order to be able to form a bi-directional switch, if the switch Q3 is of the P channel type, then the switch Q4 is of the N channel type, and vice versa. In this example, the switch Q3 is of the N channel type, and the switch Q4 is of the P channel type.

As a result, control dynamics are the same for the two switches Q1 and Q2 and for the switches Q3 and Q4. It is thus possible not only to couple firstly the control of the switches Q1 and Q3, but also secondly to couple the control of the switches Q2 and Q4.

This makes it possible to simplify the operation of the converter.

FIG. 2 specifies the following voltages:
vq1 across the terminals of Q1;
vq2 across the terminals of Q2;
vd1 across the terminals of D1;
vd2 across the terminals of D2;
vd3 across the terminals of D3;
vd4 across the terminals of D4;
vls across the terminals of Ls;
vlp across the terminals of Lp; and
vs across the terminals of Cs, i.e. the outlet voltage of the converter.

FIG. 2 also specifies the following currents:
ils through the winding Ls;
ilp through the winding Lp; and
is through the load Z of the converter, i.e. the outlet current.

The operation of the switch-mode converter is described below with reference to FIGS. 3A to 3N as a function of the (ON, OFF) control signals sent to the switches Q1 and Q2 and as a function of the (ON, OFF) control signals sent to the switches Q3 and Q4, it being understood that in the present, non-limiting example the control of the switches Q1 and Q3 is coupled as is the control of the switches Q2 and Q4. In these figures, currents flowing in the circuit are represented by bold lines. As explained below, the converter of the invention is a converter having two quadrants: (vs>0, is>0) and (vs<0, is<0).

FIGS. 3A to 3F relate to a mode of operation in which firstly a single (switch-forming) transistor Q1 or Q2 conducts while the outlet current is positive (is>0) or while the outlet current is negative (is<0), and secondly a single (switch-forming) transistor Q3 or Q4 conducts while the outlet current is positive (is>0) or while the outlet current is negative (is<0).

FIGS. 3A to 3C relate to a mode of operation in which the outlet current is is negative for one operating cycle (from t=0 to t=T).

FIG. 3A shows a first step of the operating cycle between the instants t=0 and t=t1 (where t1<T). The circuit can operate in continuous mode and in discontinuous mode. During this step, the circuit is controlled as follows:
Q2, Q3, and D4 conduct; and
Q1, Q4, and D1, D2, and D3 are blocked.

FIG. 3B shows a second step of the operating cycle, between instants t=t1 and t=t2. The circuit may operate in continuous mode (in which case t2=T) or in discontinuous mode. During this step, the circuit is controlled as follows:
Q2, Q3, and Q4 and D2 conduct; and
Q1, D1, D3, and D4 are blocked.

The control of the switches Q1 and Q3 thus remains unchanged between the first step and the second step.

FIG. 3C shows a third step of the operating cycle, solely for discontinuous mode, between t=t2 and t=T.
During this step, the circuit is controlled as follows:
Q2, Q3, and Q4 conduct;
Q1 and also D1, D2, D3, and D4 are blocked; and
the current is flowing in the load is supplied by the energy accumulated in the capacitor Cs.

The control of the switches Q1, Q3, Q3, and Q4 thus remains unchanged between the second step and the third step.

FIGS. 3D to 3F relate to a mode of operation in which the outlet current is is positive, for one operating cycle (from t=0 to t=T).

FIG. 3D shows a first step of the operating cycle between instants t=0 and t=t1 (with t1<T). The circuit can operate in continuous mode or in discontinuous mode. During this step, the circuit is controlled as follows:
Q1, Q4, and D3 conduct; and
Q2, Q3, D1, D2, and D4 are blocked.

FIG. 3E shows a second step of the operating cycle, between instants t=t1 and t=t2. The circuit may operate in continuous mode (in which case t2=T) or in dicontinuous mode. During this step, the circuit is controlled as follows:
Q1, Q3, Q4, and D1 conduct; and
Q2, D2, D3, and D4 are blocked.

The control of the switches Q2 and Q4 thus remains unchanged between the first step and the second step.

FIG. 3F shows a third step of the operating cycle, solely for AC mode, between t=t2 and t=T. During this step, the circuit is controlled as follows:
Q2, D1, D2, D3, and D4 are blocked;
Q1, Q3, and Q4 conduct; and
the current is flowing in the load is supplied by the energy accumulated in the capacitor Cs.

The control of the switches Q1, Q2, Q3, and Q4 thus remains unchanged between the second step and the third step.

FIGS. 3G to 3N relate to a mode of operation in which the two (switch-forming) transistors Q1 and Q2 conduct while the outlet current is negative (is<0) and when the outlet current is positive (is>0). The operation described is in continuous mode.

FIGS. 3G to 3J relate to a mode of operation in which the outlet current is is negative, for an operating cycle (from t=0 to t=T).

FIG. 3G shows a first step of the operating cycle, between the instants t=0 and t=t1. During this step, the circuit is controlled as follows:
Q1, Q4, and D3 conduct;
Q2, Q3, D1, and D4 are blocked; and
D2 is blocked if the outlet voltage SP presents an absolute value relative to ground that is sufficiently small.

FIG. 3H shows a second step of the operating cycle, between the instants t=t1 and t=t2. During this step, the circuit is controlled as follows:
Q1, Q3, Q4, and D1 conduct; and
Q2, D2, D3, and D4 are blocked.

FIG. 3I shows a third step of the operating cycle between instants t=t2 and t=t3. During this step, the circuit is controlled as follows:
Q2, Q3, and D4 conduct; and
Q1, Q4, D1, D2, and D3 are blocked.

FIG. 3J shows a fourth step of the operating cycle between the instants t=t3 and t=T. During this step, the circuit is controlled as follows:
Q2, Q3, Q4, and D2 conduct; and
Q1, D1, D3, and D4 are blocked.

FIGS. 3K to 3N relate to a mode of operation in which the outlet current is positive, for an operating cycle (from t=0 to t=T).

FIG. 3K shows a first step of the operating cycle, between instants t=0 and t=t1. During this step, the circuit is controlled as follows:
Q1, Q4, and D3 conduct; and
Q2, Q3, D1, D2, and D4 are blocked.

FIG. 3L shows a second step of the operating cycle, between the instants t=t1 and t=t2. During this step, the circuit is controlled as follows:
Q1, Q3, Q4, and D1 conduct; and
Q2, D2, D3, and D4 are blocked.

FIG. 3M shows a third step of the operating cycle, between the instants t=t2 and t=t3. During this step, the circuit is controlled as follows:
Q2, Q3, and D4 conduct;
Q1, Q4, D2, and D3 are blocked and
D1 is blocked if the outlet voltage SP is of absolute value relative to ground that is sufficiently small.

FIG. 3N shows a fourth step of the operating cycle, between the instants t=t3 and t=T. During this step, the circuit is controlled as follows:
Q2, Q3, and Q4 and D2 conduct; and
Q1, D1, D3, and D4 are blocked.

FIG. 4A shows the principle of using the converter of the invention as a voltage source by adding means 11 for measuring the voltage difference between the outputs SP and SM, an appropriate corrector 12 receiving a setpoint Ec, and an appropriate modulator 13. The outputs from the modulator 13 deliver the control voltage SQ13 for the transistors Q1 and Q3 and also the control voltage SQ24 for the transistors Q2 and Q4.

FIG. 4B shows the principle of use of the converter of the invention as a current source by adding means 21 for measuring the outlet current is of the converter, an appropriate corrector 22 receiving a setpoint Ec, and an appropriate modulator 23. The outputs from the modulator 23 supply the control voltage Q13 for the transistors Q1 and Q3, and also the control voltage SQ24 for the transistors Q2 and Q4.

Figure 1A:
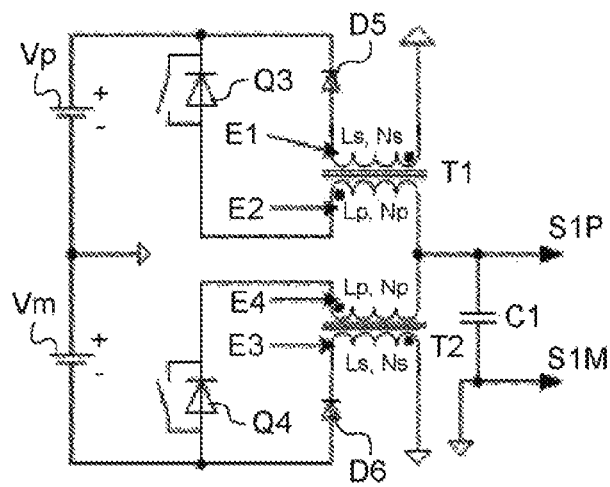
FIGS. 1A and 1B are described above and show respectively a circuit diagram of a prior art switch-mode converter delivering a DC voltage to the terminals of a load, and a circuit diagram of said converter used as a switch-mode current source by adding means for measuring the outlet current and an appropriate corrector and an appropriate modulator.
Figure 1B:
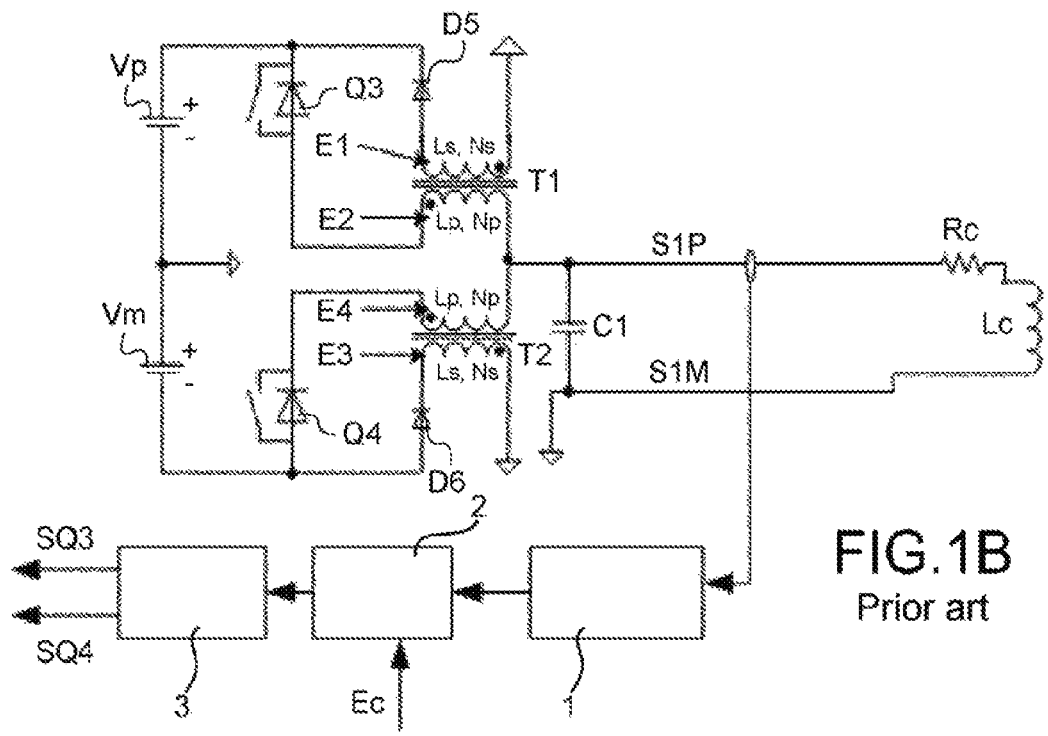

It can thus be seen that the converter of the invention, like the converter described with reference to FIGS. 1A and 1B can be converted into a switch-mode current source by adding means for (directly or indirectly) measuring the current in the load, and an appropriate corrector and modulator. Likewise, it can be seen that the converter of the invention can be converted into a switch-mode voltage source by adding means for (directly or indirectly) measuring the voltage difference across the terminals of the load, and an appropriate corrector and modulator.

The invention is not limited to the above description but covers any variant coming within the ambit defined by the claims.

In particular, although the switches described are N or P channel MOSFET elements, they could be replaced by any other switch having the ability to conduct bi-directionally and the ability to block forward.

Furthermore, although the control signals for the switches Q1, Q3, and also to the switches Q2, Q4 are coupled, it is possible for these control signals to be decoupled so as to control the converter more finely.

The invention claimed is:

1. A switch-mode converter powered by a positive voltage and a negative voltage, both relative to a ground, and delivering an outlet voltage between a first outlet terminal and a second outlet terminal, which the second outlet terminal is connected to the ground either directly or via a resistance, the switch-mode converter having two windings wound in opposition about a magnetic core:
   a first end of the first winding being connected to a midpoint of a first branch that connects the positive voltage to the negative voltage, a portion of the first branch connecting its midpoint to the positive voltage comprising a series connection of first switch-forming means and a first diode in forward connection relative to the positive voltage and together forming a unidirectional switch having forward and reverse blocking power, the portion of the first branch connecting its midpoint to the negative voltage comprising a series connection of second switch-forming means and a second diode forwardly mounted relative to the negative voltage and together forming a unidirectional switch having forward and reverse blocking power;
   a second end of the first winding being connected to the first outlet terminal; and
   a first end of the second winding being connected to a midpoint of a second branch that connects the positive voltage to the negative voltage and that comprises a third diode and a fourth diode in reverse connection, the midpoint of the second branch being situated between the third diode and the fourth diode;
   the switch-mode converter being characterized in that it includes third switch-forming means and fourth switch-forming means together forming a bidirectional switch having forward and reverse blocking power, the third and fourth means being arranged in series between a second end of the second winding and the ground.

2. The switch-mode converter according to claim 1, wherein a smoothing capacitor is connected between the first outlet terminal of the switch-mode converter and ground.

3. The switch-mode converter according to claim 1, wherein, in the first branch connecting the positive voltage to the negative voltage, said series connection consists in arranging the first and second switch-forming means beside the respective positive and negative voltages and in arranging the first and second diodes beside the midpoint of the first branch.

4. The switch-mode converter according to claim 1, wherein the first, second, third, and fourth switch-forming means are selected from MOS transistors, bipolar transistors, and insulated gate bipolar transistors, or any other switch having a capacity for conducting bidirectionally and a capacity for forward blocking.

5. The switch-mode converter according to claim 1, wherein the third and fourth switch-forming means are selected from MOS transistors.

6. The switch-mode converter according to claim 1, wherein the third and fourth switch-forming means are respectively one of them an N channel MOS transistor and the other one a P channel MOS transistor.

7. The switch-mode converter according to claim 1, wherein the third switching means is of the same type as the first switch-forming means.

8. The switch-mode converter according to claim 1, wherein the second switch-forming means is of the same type as the fourth switch-forming means.

9. The switch-mode converter according to claim 1, further comprising a measurement means for measuring the outlet voltage of the switch-mode converter, the measurement means delivering an output signal representative of the outlet voltage to a first input of regulator means having a second input receiving a setpoint signal, the regulator means delivering a signal that is supplied to an input of a modulator having a first output sending a common control signal to the first switch-forming means and to the third switch-forming means, and having a second output sending a common control signal to the second switch-forming means and to the fourth switch-forming means, the switch-mode converter thus being configured as a voltage source.

10. The switch-mode converter according to claim 1, further comprising a measurement means for measuring an outlet current of the switch-mode converter, the measurement means delivering an output signal representative of the outlet current of the switch-mode converter to a first input of regulator means having a second input receiving a setpoint signal, the regulator means delivering a signal that is supplied to an input of a modulator having a first output that sends a common control signal to the first switch-forming means and to the third switch-forming means, and a second output that sends a common control signal to the second switch-forming means and to the fourth switch-forming means, the switch-mode converter thus being configured as a current source.

11. An electromechanical actuator control including the switch-mode converter according to claim 1.

12. A regulator including the switch-mode converter according to claim 1.

13. A terrestrial, a marine, or an aviation equipment including the switch-mode converter according to claim 1.

14. A turbine engine including the switch-mode converter according to claim 1.

* * * * *